(12) United States Patent
Jung et al.

(10) Patent No.: US 8,921,182 B2
(45) Date of Patent: Dec. 30, 2014

(54) METHOD FOR FABRICATING 3D NONVOLATILE MEMORY DEVICE WITH VERTICAL CHANNEL HOLE

(75) Inventors: Sung-Wook Jung, Gyeonggi-do (KR); Yun-Kyoung Lee, Gyeonggi-do (KR); Young-Soo Ahn, Gyeonggi-do (KR); Tae-Hwa Lee, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 252 days.

(21) Appl. No.: 13/604,436

(22) Filed: Sep. 5, 2012

(65) Prior Publication Data
US 2013/0309849 A1 Nov. 21, 2013

(30) Foreign Application Priority Data
May 15, 2012 (KR) .................. 10-2012-0051567

(51) Int. Cl.
*H01L 21/336* (2006.01)

(52) U.S. Cl.
USPC .......................................... 438/268; 438/269

(58) Field of Classification Search
CPC .................. H01L 27/11582; H01L 27/11578; H01L 29/7926; H01L 29/66833
USPC .................................................... 438/268, 269
See application file for complete search history.

(56) References Cited

U.S. PATENT DOCUMENTS

| | | | |
|---|---|---|---|
| 2009/0272982 A1* | 11/2009 | Nakamura et al. | 257/77 |
| 2010/0078701 A1* | 4/2010 | Shim et al. | 257/314 |
| 2012/0156848 A1* | 6/2012 | Yang et al. | 438/287 |
| 2012/0168858 A1 | 7/2012 | Hong | |

* cited by examiner

*Primary Examiner* — Michael Jung
*Assistant Examiner* — John P Dulka
(74) *Attorney, Agent, or Firm* — IP & T Group LLP (57) ABSTRACT

A method for fabricating a nonvolatile memory device includes forming a stacked structure having a plurality of interlayer dielectric layers and a plurality of sacrificial layers wherein interlayer dielectric layers and sacrificial layers are alternately stacked over a substrate, forming a first hole exposing a part of the substrate by selectively etching the stacked structure, forming a first insulation layer in the first hole, forming a second hole exposing the part of the substrate by selectively etching the first insulation layer, and forming a channel layer in the second hole.

7 Claims, 6 Drawing Sheets

METHOD FOR FABRICATING 3D NONVOLATILE MEMORY DEVICE WITH VERTICAL CHANNEL HOLE

CROSS-REFERENCE TO RELATED APPLICATIONS

The present application claims priority of Korean Patent Application No. 10-2012-0051567, filed on May 15, 2012, which is incorporated herein by reference in its entirety.

BACKGROUND

1. Field

The present invention relates to a method for fabricating a nonvolatile memory device, and more particularly, to a method for fabricating a nonvolatile memory device including a plurality of memory cells stacked vertically over a substrate.

2. Description of the Related Art

A nonvolatile memory device is a memory device which maintains data stored therein although power supply is cut off. Currently, various nonvolatile memory devices, for example, NAND Flash memory and the like are widely used.

Recently, as the improvement in integration degree of nonvolatile memory devices having a 2D structure in which memory cells are formed as a single layer over a semiconductor substrate approaches the limit, a nonvolatile memory device having a 3D structure in which a plurality of memory cells are stacked vertically over a silicon substrate has been proposed.

The 3D nonvolatile memory device may be fabricated by the following series of steps of: alternately stacking a plurality of interlayer dielectric layers and a plurality of sacrificial layers over a substrate; selectively etching the stacked structure to form a channel hole passing through the stacked structure; forming a memory layer and a channel in the channel hole; and replacing the sacrificial layer with a gate electrode layer. Alternatively, the 3D nonvolatile memory device may be fabricated by the following series of steps of: alternately stacking a plurality of interlayer dielectric layers and a plurality of gate electrode layers over a substrate; selectively etching the stacked structure to form a channel hole passing through the stacked structure; and forming a memory layer and a channel in the channel hole. At this time, one gate electrode layer and the memory layer and the channel, which are contacted with the gate electrode layer, form a unit memory cell.

Here, the channel hole may have a constant diameter regardless of the height. In other words, the sidewalls of the channel hole may have a vertical profile. This is because the channel hole must have a constant diameter to uniformly secure the characteristics of the memory cells.

However, when the stacked structure of the interlayer dielectric layers and the sacrificial layers or the stacked structure of the interlayer dielectric layers and the gate electrode layers is etched to form the channel hole, it may be difficult to form a channel hole having a vertical profile. This is because the interlayer dielectric layer and the sacrificial layer or the interlayer dielectric layer and the gate electrode layer are formed of materials having different etch rates from each other. Such a concern may become more serious as the height of the stacked structure is increased to improve the integration degree of the device.

SUMMARY

An embodiment of the present invention is directed to a method for fabricating a nonvolatile memory device, which is capable of uniformly securing characteristics of a plurality of memory cells through process improvement.

In accordance with an embodiment of the present invention, a method for fabricating a nonvolatile memory device includes forming a stacked structure in which a plurality of interlayer dielectric layers and a plurality of sacrificial layers are alternately stacked over a substrate; forming a first hole exposing the substrate by selectively etching the stacked structure; forming a first insulation layer in the first hole; forming a second hole exposing the substrate by selectively etching the first insulation layer; forming a channel layer in the second hole; forming a slit to expose the plurality of sacrificial layers in the stacked structure; removing the exposed sacrificial layers; forming grooves by removing the first insulation layer exposed by removing the sacrificial layers until a sidewall of the second hole are exposed; and forming gate electrode layers buried in the grooves and contacted with the channel layer with a memory layer interposed therebetween.

In accordance with another embodiment of the present invention, a method for fabricating a nonvolatile memory device includes, forming a stacked structure in which a plurality of interlayer dielectric layers and a plurality of sacrificial layers are alternately stacked over a substrate, wherein thicknesses of the sacrificial layers decrease from downward to upward; forming a first hole which exposes the substrate and has a diameter increasing from downward to upward by selectively etching the stacked structure; forming a first insulation layer in the first hole; forming a second hole which exposes the substrate and has a smaller sidewall slope than the first hole by selectively etching the first insulation layer; forming a channel layer in the second hole; forming a slit to expose the plurality of sacrificial layers in the stacked structure; removing the exposed sacrificial layers; forming grooves by removing the first insulation layer and the interlayer dielectric layers exposed by removing the sacrificial layers until a sidewall of the second hole are exposed; and forming gate electrode layers buried in the grooves and contacted with the channel layer with a memory layer interposed therebetween.

In accordance with still another embodiment of the present invention, a method for fabricating a nonvolatile memory device includes, forming a stacked structure having a plurality of interlayer dielectric layers and a plurality of sacrificial layers wherein the interlayer dielectric layers and the sacrificial layers are alternately stacked over a substrate; forming a first hole exposing the substrate by selectively etching the stacked structure; forming a first insulation layer in the first hole; forming a second hole exposing the substrate by selectively etching the first insulation layer; and forming a channel layer in the second hole.

DETAILED DESCRIPTION

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The drawings are not necessarily to scale and in some instances, proportions may have been exaggerated in order to clearly illustrate features of the embodiments. When a first layer is referred to as being "on" a second layer or "on" a substrate, it not only refers to a case where the first layer is formed directly on the second layer or the substrate but also a case where a third layer exists between the first layer and the second layer or the substrate.

Hereafter, referring to FIGS. 1 to 8, a method for fabricating a nonvolatile memory device in accordance with an embodiment of the present invention will be described. FIGS. 1 to 7 are cross-sectional views illustrating the method for fabricating a nonvolatile memory device in accordance with the embodiment of the present invention. FIG. 8 is a plan view of a mask pattern used during processes of FIGS. 2 and 4.

Figure 1:
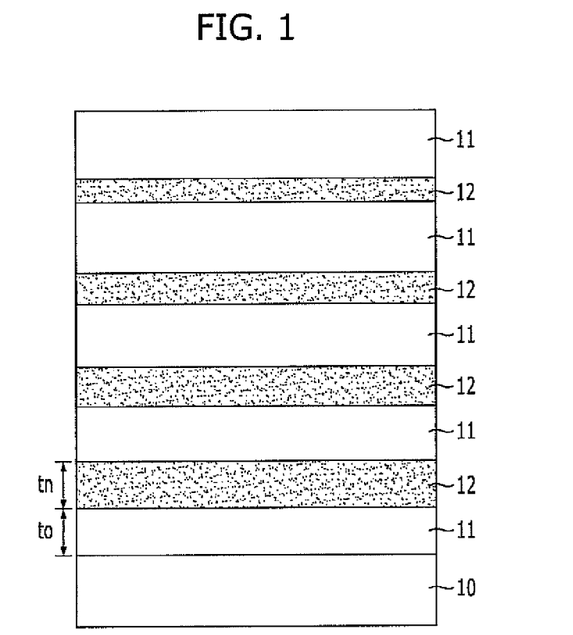
FIGS. 1 to 7 are cross-sectional views illustrating a method for fabricating a nonvolatile memory device in accordance with an embodiment of the present invention.

Referring to FIG. 1, a substrate 10 is prepared. The substrate 10 may be formed of a semiconductor material such as single-crystal silicon, and may include a required predetermined structure, for example, a source area (not illustrated).

Subsequently, a plurality of interlayer dielectric layers 11 and a plurality of sacrificial layers 12 are alternately stacked in a vertical direction on the substrate 10. Here, the sacrificial layer 12 serves to provide a space where a gate electrode of a memory cell (hereafter, referred to as a cell gate electrode) is to be formed, and may be formed of a material having an etching selectivity with the interlayer dielectric layer 11, for example, nitride. The interlayer dielectric layer 11 serves to isolate the cell gate electrodes from each other, and may be formed of oxide, for example.

In this embodiment of the present invention, thicknesses (tn) of the sacrificial layers 12 may decrease from downward to upward. This is in order to constantly control vertical widths, i.e., thicknesses of the cell gate electrodes. Furthermore, thicknesses (to) of the interlayer dielectric layers 11 may increase from downward to upward. This is in order to constantly control a vertical distance between the cell gate electrodes. This will be described below in more detail. However, the present invention is not limited thereto, but the thicknesses (tn) of the sacrificial layers 12 and the thicknesses (to) of the interlayer dielectric layers 11 may be controlled differently from this embodiment of the present invention.

Figure 2:
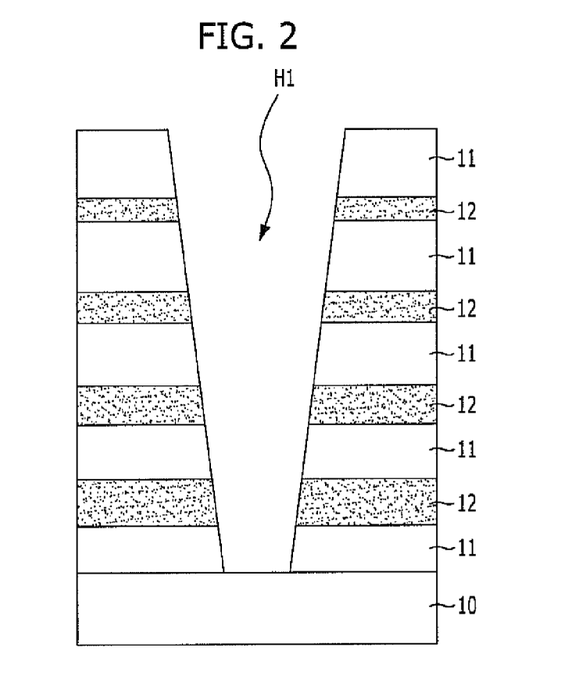

Referring to FIG. 2, the stacked structure of the interlayer dielectric layers 11 and the sacrificial layers 12 is selectively etched to form a first hole H1 exposing a part of the substrate 10. The first hole H1 may be formed using a first mask pattern M1 (refer to FIG. 8) as an etch mask. The first mask pattern M1 exposes an area in which a channel hole is to be formed and which has a larger width than a horizontal width of the channel hole. Furthermore, the etching process for forming the first hole H1 may include a dry etching process in which an etching gas capable of etching the interlayer dielectric layer 11 and an etching gas capable of etching the sacrificial layer 12 are alternately used.

At this time, since the interlayer dielectric layer 11 and the sacrificial layer 12 are formed of materials having an etching selectivity with each other, it is difficult to form the first hole H1 such that the sidewalls thereof have a vertical profile. Furthermore, due to the characteristic of the etching process, the first hole H1 may have an inclined profile where the horizontal width, i.e., the diameter thereof increases from downward to upward, as illustrated in FIG. 2.

Figure 3:
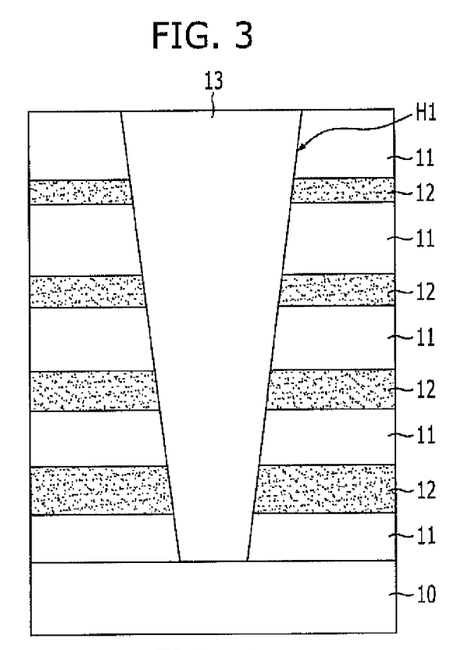

Referring to FIG. 3, a first insulation layer 13 is formed to fill the first hole H1. The first insulation layer 13 may be performed by the following process: an insulating material is deposited on the entire resultant structure having the first hole H1 formed therein to such a thickness as to sufficiently fill the first hole H1, and a planarization process, for example, chemical mechanical polishing (CMP) is performed until the uppermost interlayer dielectric layer 11 is exposed.

At this time, the first interlayer dielectric layer 13 may be formed of a material having substantially the same etch rate as the interlayer dielectric layer 11. The first interlayer dielectric layer 13 may be formed of the same material as the interlayer dielectric layer 11, for example, oxide. This is in order to constantly control the vertical widths, i.e., the thicknesses of the cell gate electrodes. This will be described below in more detail.

Figure 4:
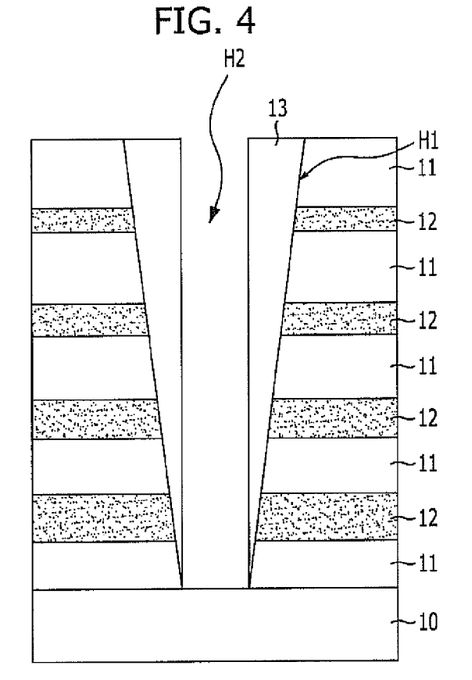

Referring to FIG. 4, the first insulation layer 13 buried in the first hole H1 is selectively etched to form a second hole H2 exposing a part of the substrate 10. The second hole H2 may be formed using a second mask pattern M2 (refer to FIG. 8) as an etch mask. The second mask pattern M2 exposes an area where the channel hole is to be formed. That is, the second hole H2 is substantially used as the channel hole. Furthermore, the etching process for forming the second hole H2 may include a dry etching process.

At this time, since the second hole H2 is formed by etching the first insulation layer 13 formed of a single material, the etching process may be easily and simply performed. Furthermore, the sidewall slope of the second hole H2 may be smaller than that of the first hole H1, and the second hole H2 may have substantially a vertical profile. When the second hole H2 has a small sidewall slope, specially vertical sidewall, the diameter of the hole H2 is controlled to almost the same value, regardless of the height. Therefore, it is possible to uniformly secure the characteristics of the memory cells.

Figure 5:
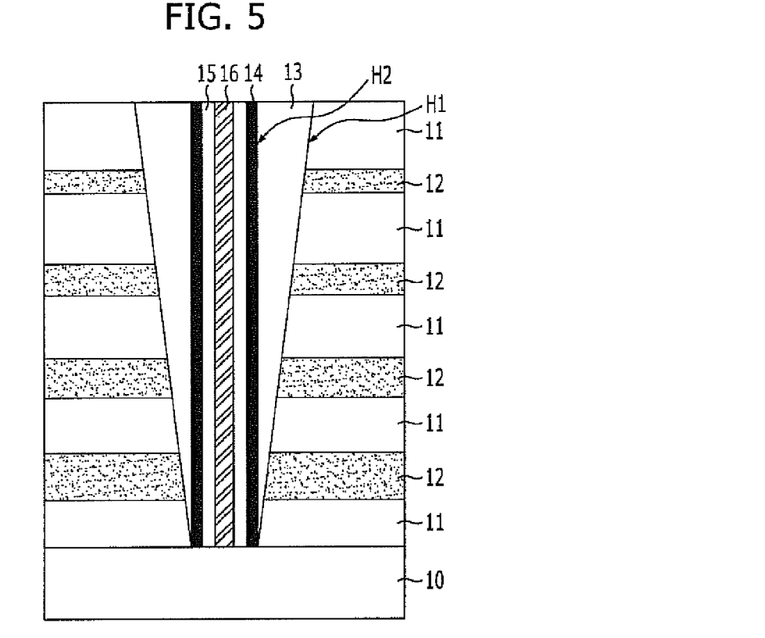

Referring to FIG. 5, a memory layer 14 is formed on the sidewalls of the second hole H2, a channel layer 15 is formed on the memory layer 14, and a space remaining in the second hole H2 is filled with an insulating material 16.

The memory layer 14 may be formed by sequentially depositing a charge blocking layer, a charge storing layer, and a tunnel insulation layer. The charge blocking layer may be formed of oxide, the charge storing layer may be formed of nitride, and the tunnel insulation layer may be formed of oxide.

The channel layer 15 may be formed of an impurity-doped semiconductor material or undoped semiconductor material. In this embodiment of the present invention, the channel layer 15 has such a thickness as not to completely fill the second hole H2, but the present invention is not limited thereto. In another embodiment, the channel layer 15 may have such a thickness as to completely fill the second hole H2. In this case, the formation of the insulating material 16 is omitted.

Figure 6:
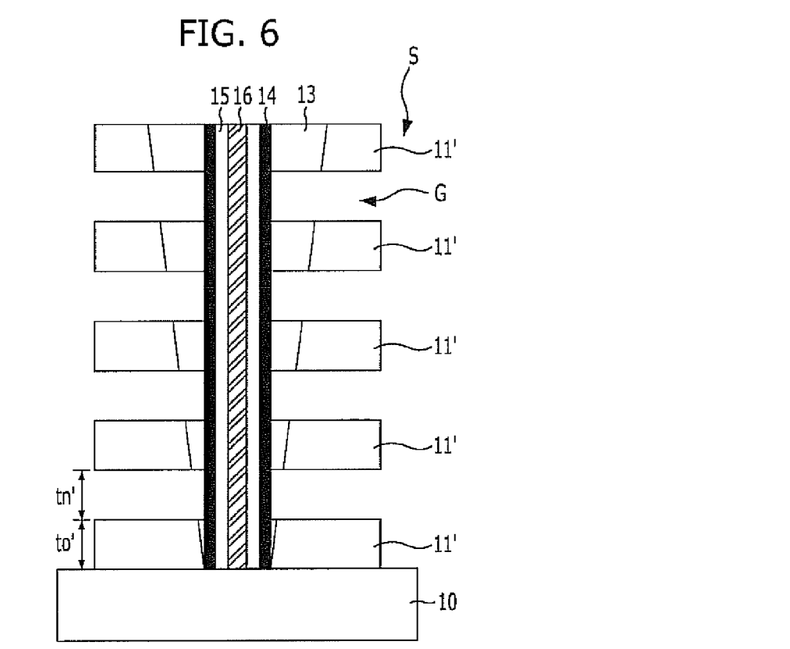

Referring to FIG. 6, a slit S passing through the stacked structure of the interlayer dielectric layers 11 and the sacrificial layers 12 is formed in an area where the first and second hole H1 and H2 are not formed.

The slit S serves to provide a space through which a wet etchant may permeate to remove the sacrificial layers 12. In this embodiment of the present invention, the slit S has such a depth as to pass through the stacked structure, but the present invention is not limited thereto. The slit S may have a depth to the bottom of the lowermost sacrificial layer 12.

Then, the sacrificial layers 12 exposed by the slit S are removed to expose the first insulation layer 13, and the exposed first insulation layer 13 is further removed until the memory layer 14 formed on the sidewall of the second hole H2 is exposed, thereby forming grooves G. The sacrificial layers 12 and the first insulation layer 13 may be removed by a wet etching process.

At this time, in order to expose the memory layer 14, the first insulation layer 13 in an area corresponding to the sacrificial layer 12 positioned at a relatively upper part may be removed more than the first insulation layer 13 in an area corresponding to the sacrificial layer 12 positioned at a relatively lower part. Meanwhile, the first insulation layer 13 may be formed of a material having substantially the same etch rate as the interlayer dielectric layer 11. In this case, while the first insulation layer 13 is removed, the interlayer dielectric layer 11 may be removed to a predetermined thickness over and under the space where the sacrificial layer 12 is removed. At this time, since the removal amounts of the first insulation layers 13 increase upward, the removal amounts of the interlayer dielectric layers 11 also increase upward. The interlayer dielectric layer 11 removed to a predetermined thickness by this process is referred to as an interlayer dielectric layer pattern 11'.

In this embodiment of the present invention, the thicknesses (tn) of the sacrificial layers 12 decrease from downward to upward, but the removal amounts of the interlayer dielectric layers 11 increase from downward to upward. Therefore, the vertical widths (tn') of the grooves G may be constantly controlled. When the vertical widths (tn') of the grooves G are constantly controlled, it means that the cell gate electrodes to be described below have a constant thickness. Accordingly, the uniformity of the memory cells may be further improved.

Furthermore, the thicknesses of the interlayer dielectric layers 11 increase from downward to upward, but the removal amounts of the interlayer dielectric layers 11 also increase from downward to upward. Therefore, the thicknesses (to') of the interlayer dielectric layer patterns 11' may be constantly controlled. When the thicknesses of the interlayer dielectric layer patterns 11' are constantly controlled, it means that the distance between the cell gate electrodes to be described below is constant. Accordingly, the uniformity of the memory cells may be further improved.

Figure 7:
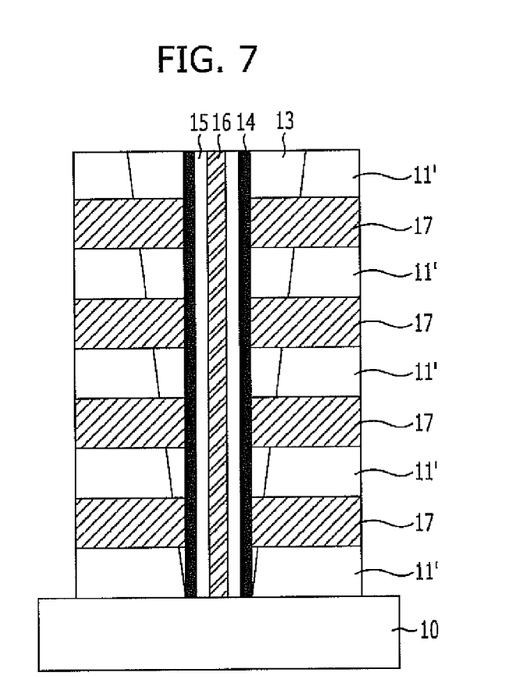
Figure 8:
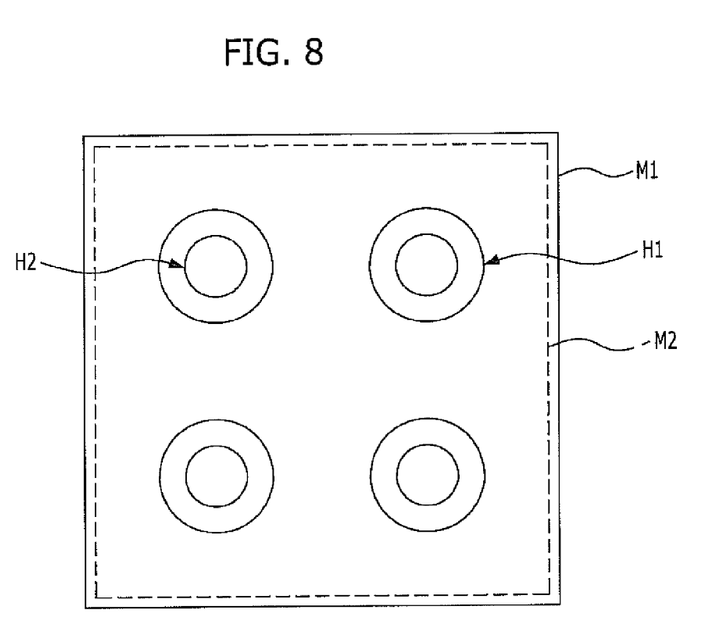
FIG. 8 is a plan view of a mask pattern used during processes shown in FIGS. 2 and 4.

Referring to FIG. 7, a conductive material is buried in the groove G to form a cell gate electrode layer 17. The cell gate electrode layer 17 may be formed by the following process: a conductive material is formed to cover the resultant structure having the grooves G formed therein and a blanket etching process is then performed. The cell gate electrode layer 17 may be formed of impurity-doped polysilicon or metal.

Meanwhile, although not illustrated, a material layer for the charge blocking layer, for example, an oxide layer may be additionally formed along the inner wall of the groove G, before the cell gate electrode layer 17 is formed. The material layer serves to compensate for damage of the charge blocking layer positioned at the outermost side of the memory layer 14 while the first insulation layer 13 is removed to form the groove G.

As the result of this process, a plurality of unit memory cells each including one cell gate electrode layer 17, the memory layer 14 contacted with the cell gate electrode layer 17, and the channel layer 15 are formed.

Although not illustrated, a well-known subsequent process such as a process of forming a bit line connected to the top of the channel layer 15 may be performed. However, since the subsequent process is widely known to those skilled in the art, the detailed descriptions thereof are omitted herein.

In the method for fabricating a nonvolatile memory device in accordance with the embodiment of the present invention, since the diameter of the channel hole H2 is constantly controlled, it is possible to secure the uniformity of the memory cells. Furthermore, the thicknesses of the sacrificial layers 12 and/or the interlayer dielectric layers 11 may be controlled to constantly maintain the thicknesses of the cell gate electrode layers 17 and/or the distance between the cell gate electrode layers 17. Therefore, it is possible to further increase the uniformity of the memory cells.

Meanwhile, the above-described method for fabricating a nonvolatile memory device may be modified in various manners. Hereafter, referring to FIGS. 9 to 11, one modification will be described in detail.

Figure 9:
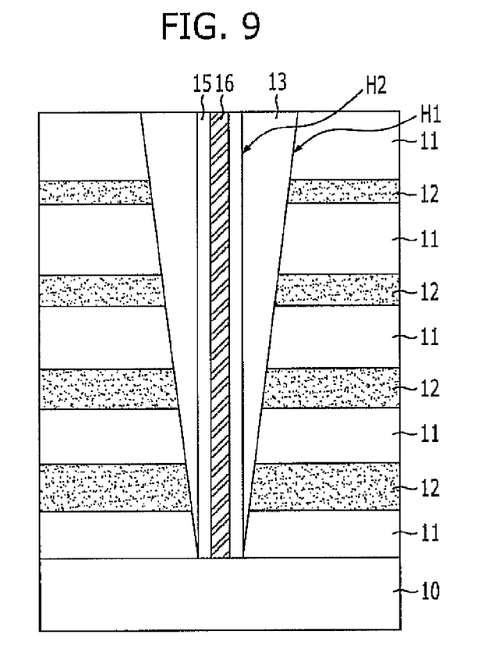
FIGS. 9 to 11 are cross-sectional views illustrating a method for fabricating a nonvolatile memory device in accordance with another embodiment of the present invention.
Figure 10:
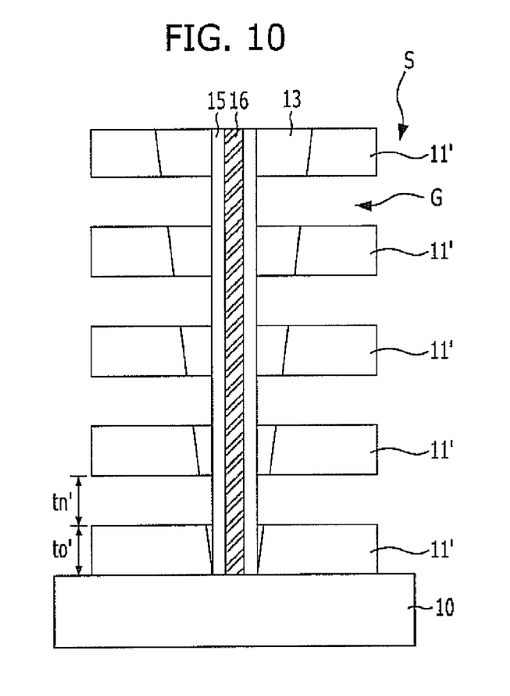
Figure 11:
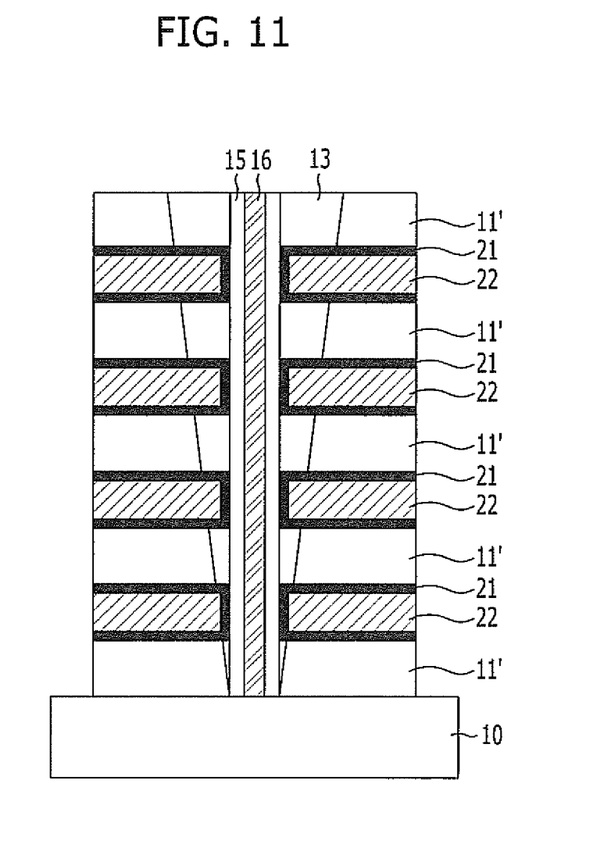

FIGS. 9 to 11 are cross-sectional views illustrating a method for fabricating a nonvolatile memory device in accordance with another embodiment of the present invention. The descriptions of the method for a nonvolatile memory device in accordance with the embodiment of the present invention will be focused on differences from the above-described embodiment of the present invention.

First, the above-described processes of FIGS. 1 to 4 are performed.

Then, referring to FIG. 9, a channel layer 15 is formed on sidewalls of the second hole H2, and an insulating material 16 is buried in a remaining space of the second hole H2. That is, the process of forming the memory layer 14 may be omitted unlike the above-described embodiment of the present invention.

Referring to FIG. 10, a slit S is formed through the stacked structure of the interlayer dielectric layers 11 and the sacrificial layers 12.

The sacrificial layers 12 exposed through the slit S are removed to expose the first insulation layer 13, and the exposed first insulation layer 13 is removed until the channel layer 15 is exposed, thereby forming grooves G.

Referring to FIG. 11, a memory layer 21 is formed by sequentially depositing a tunnel insulation layer, a charge storing layer, and a charge blocking layer along the inner wall of the groove G, and a conductive material is buried in a remaining space of the groove G to form a cell gate electrode layer 22.

This embodiment of the present invention is different from the above-described embodiment of the present invention in that the memory layer 21 is formed along the inner wall of the groove G instead of the second hole H2. The memory layer 21 may have any shape as long as the memory layer 21 is interposed between the cell gate electrode layer 22 and the channel layer 15. Therefore, the formation sequence may be changed in various manners.

In accordance with the embodiments of the present invention, it is possible to uniformly secure the characteristics of a plurality of memory cells through the process improvement.

While the present invention has been described with respect to the specific embodiments, it will be apparent to those skilled in the art that various changes and modifications may be made without departing from the spirit and scope of the invention as defined in the following claims.

What is claimed is:

1. A method for fabricating a nonvolatile memory device, comprising:
forming a stacked structure in which a plurality of interlayer dielectric layers and a plurality of sacrificial layers are alternately stacked over a substrate, wherein thicknesses of the sacrificial layers decrease from downward to upward;

forming a first hole which exposes the substrate and has a diameter increasing from downward to upward by selectively etching the stacked structure;

forming a first insulation layer in the first hole;

forming a second hole which exposes the substrate and has a smaller sidewall slope than the first hole by selectively etching the first insulation layer;

forming a channel layer in the second hole;

forming a slit to expose the plurality of sacrificial layers in the stacked structure;

removing the exposed sacrificial layers;

forming grooves by etching the first insulation layer exposed by removing the sacrificial layers until a sidewall of the second hole is exposed, wherein parts of the interlayer dielectric layers exposed by removing the sacrificial layers are etched together with the first insulation layer, wherein an etching amount of the first insulation layer is substantially same as that of the parts of the interlayer dielectric layers, and wherein the etching amounts of the first insulation layer and the parts of the interlayer dielectric layers increase from downward to upward so that the grooves have substantially the same thickness; and forming gate electrode layers buried in the grooves and contacted with the channel layer with a memory layer interposed therebetween.

2. The method of claim 1, wherein the first insulation layer and the interlayer dielectric layer have the same etch rate.

3. The method of claim 1, wherein thicknesses of the interlayer dielectric layers increase from downward to upward so that the etched interlayer dielectric layers have the substantially same thickness.

4. The method of claim 1, wherein the forming of the first hole is performed using a first mask pattern which exposes an area overlapping a channel formation area and having a larger width than the channel formation area, and the forming of the second hole is performed using a second mask pattern which exposes the channel formation area.

5. The method of claim 1, further comprising forming the memory layer in the second hole, before the forming of the channel layer.

6. The method of claim 5, further comprising forming a charge blocking layer along inner walls of the grooves, before the forming of the gate electrode layers.

7. The method of claim 1, further comprising forming the memory layer along inner walls of the grooves, after the forming of the grooves.

\* \* \* \* \*